(12) United States Patent
Kuo

(10) Patent No.: US 6,268,256 B1
(45) Date of Patent: Jul. 31, 2001

(54) METHOD FOR REDUCING SHORT CHANNEL EFFECT

(75) Inventor: Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/484,788

(22) Filed: Jan. 18, 2000

(51) Int. Cl.⁷ .................................................. H01L 21/336
(52) U.S. Cl. ................................................................ 438/305
(58) Field of Search ........................... 438/305, 286, 438/289, 291, 301, 306, 174, 194, 217; 257/408

(56) References Cited

U.S. PATENT DOCUMENTS

| | | | |
|---|---|---|---|
| 5,360,749 | * | 11/1994 | Anjum et al. ........................... 437/25 |
| 5,492,847 | * | 2/1996 | Kao et al. ............................... 437/44 |
| 5,552,332 | * | 9/1996 | Tseng et al. ............................ 437/41 |

\* cited by examiner

*Primary Examiner*—David Nelms
*Assistant Examiner*—Quoc Hoang

(57) ABSTRACT

A method for reducing the short channel effect of a metal-oxide-semiconductor device by forming a pocket region in a substrate is disclosed, in which the substrate has a channel region under the gate of the device, the channel region has an anti-punch-through region formed thereunder, and a lightly-doped drain region is under the edge portion of the gate. The method includes implanting silicon at a region between the anti-punch-through region and a pre-defined source/drain region to form a point defect region under the lightly-doped drain region, and annealing the substrate such that the dopant in the anti-punch-through region diffuses into the point defect region.

14 Claims, 3 Drawing Sheets

METHOD FOR REDUCING SHORT CHANNEL EFFECT

BACKGROUND OF THE INVENTION

1. Field of the Invention

The present invention generally relates to a method for reducing short channel effect, and more particularly to a method for forming pocket regions in a metal-oxide-semiconductor transistor.

2. Description of the Prior Art

Referring to FIG. 1, a schematic representation of the structure for a conventional MOS (metal-oxide-semiconductor) transistor with a pocket region formed therein. In FIG. 1, a substrate 100 is provided with a gate oxide layer 122 and a gate electrode 130 formed thereon, and spacers 124 are formed on the sidewalls of the gate oxide layer 122 and the gate electrode 130. Moreover, LDD (Lightly-Doped Drain) regions 115 are formed under the spacers 124, and a channel region 112 is formed between the LDD regions 115. Source/drain regions 117 are formed on the other sides of the LDD regions 115, and an APT (anti-punch-through) region 113 is formed between the source/drain regions. The conductivity type of the source/drain regions 117 is the same as the LDD regions 115, and the conductivity type of the channel region 112 is the same as the APT region 113 which is opposite to the source/drain regions'. When the scale of gate shrinks, the distance between the source and drain is shorter so that the short channel effect takes place. A conventional method for solving this effect is to form pocket regions 116 between the APT region 113 and the source/drain regions 117, in which the conductivity type of the pocket regions 116 is the same as the APT region 113.

For the deep sub-micron device, how to decrease the short channel effect to prevent threshold voltage rolling-off is an important issue. A conventional method is to increase the concentration of the pocket region to generate the reverse short channel effect to increase the threshold voltage. However, the increased concentration of the pocket region will increase the resistant of the LDD regions, and then the Idsat as well as the driving current of the device decrease.

SUMMARY OF THE INVENTION

In accordance with the present invention, a method is provided for forming pocket regions in a semiconductor transistor that substantially does not increase the resistant of LDD regions and which will decrease the short channel effect.

In one embodiment, a method for forming a metal-oxide-semiconductor transistor is provided. The method includes providing a substrate of a first conductivity type, and then forming a channel region and an anti-punch-through region of the first conductivity type in said substrate, in which the channel region is at the top of the substrate and the anti-punch-through region is under the channel region. Then, a gate is formed on the substrate. As a key step of this invention, silicon is implanted at a region between the anti-punch-through region and a pre-defined source/drain region for forming a point defect region under the lightly-doped drain region. Then, the substrate is annealed such that the dopant in the anti-punch-through region diffuses into the point defect region. Next, a lightly-doped-drain region of a second conductivity type is formed where the second conductivity type is opposite to the first conductivity type. Then, a conformal dielectric layer is formed on the substrate and the gate, and followed by an anisotropically blanket etching to etch the dielectric layer to form a spacer on the sidewall of the gate. Finally, source/drain regions with the second conductivity type are formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
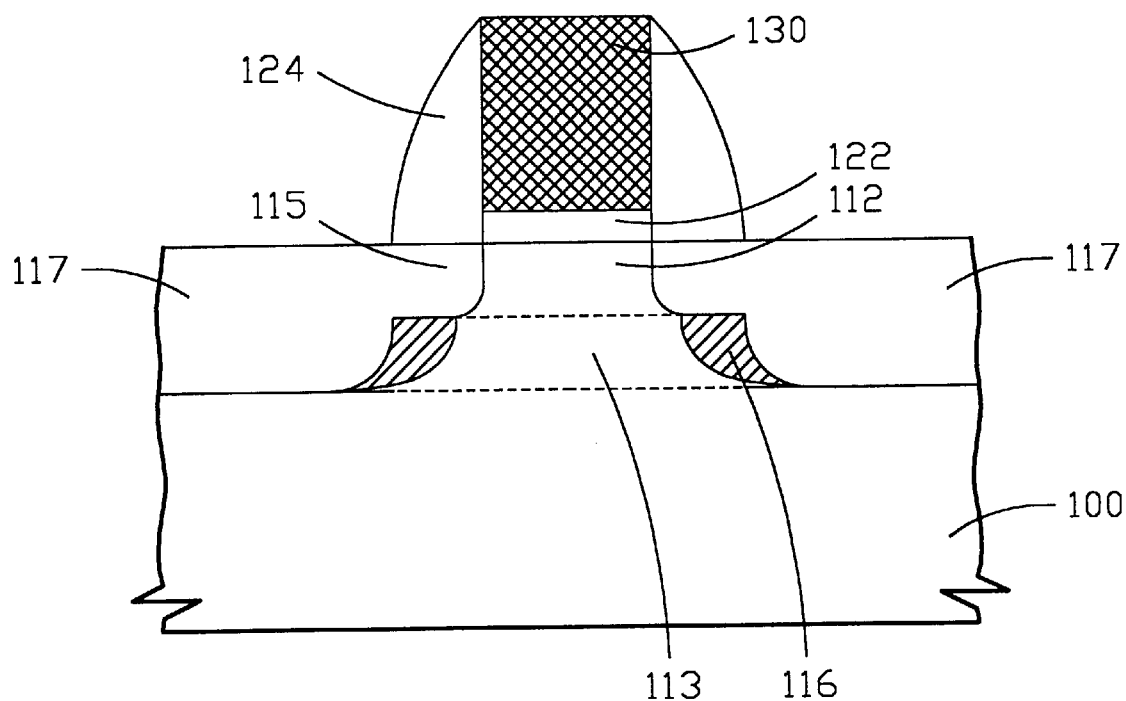
FIG. 1 is a schematic representation of structure for the conventional MOS transistor.

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

The present invention utilizes silicon to perform high concentration in the pocket implant, such that a point defect region is formed under the LDD region and between the source/drain regions and the APT region. Then, an activation anneal is performed such that the dopant of the APT region in a well will diffuse into the point defect region. The LDD regions and the source/drain regions are formed successively after increasing the pocket concentration, so the short channel effect can be reduced, and the junction depth of LDD regions as well as the source/drain regions can be prevented from increasing.

And, a preferred embodiment is introduced for a pocket region in a MOS transistor in accordance with the present invention. A flow chart will be set forth first. A substrate is provided first with a defined active area formed thereon. Then, STI (shallow trench isolation) regions are formed around the active area in the substrate. Next, a gate oxide layer and a gate electrode are formed on the active area. Subsequently, as the key step of this invention, the silicon is implanted into the pocket region to form a point defect region. Then, the following steps are similar to the conventional steps for forming a MOS transistor; that is the LDD regions, spacers, and source/drain regions are successively formed. The following will set forth the formulation of pocket region in a MOS transistor according to the present invention with the aid of FIG. 2A to FIG. 2F at various stages.

Figure 2A:
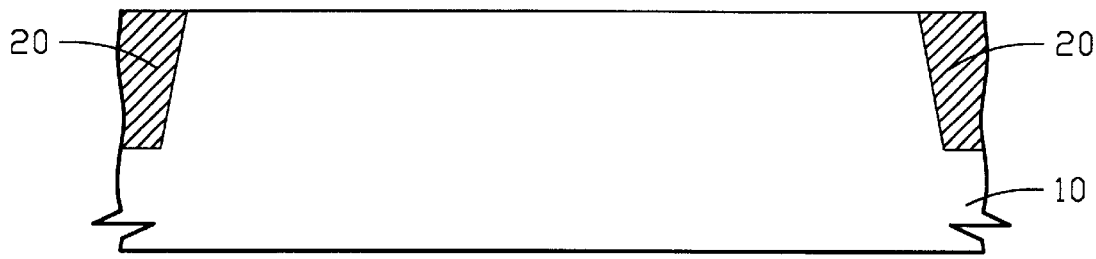
FIGS. 2A to 2F are schematic representations of structures at various stages during the formulation of pocket region in a semiconductor transistor in accordance with a method disclosed.

Referring to FIG. 2A, a substrate 10 is provided with an isolation device 20 formed therein for electrically isolating peripheral devices. In this embodiment, the isolation device 20 is STI, but conventional FOX (field oxide) formed by LOCOS (local oxidation of silicon) process may be used. The method for forming STI comprises forming a silicon nitride layer (not shown in the figure) on the active area and etching a portion of the silicon nitride layer to form an opening by using any conventional lithography. Then, the substrate 10 is etched using the silicon nitride layer as a mask to form a trench, and a silicon oxide layer is formed in the trench using any conventional deposition method.

Figure 2B:
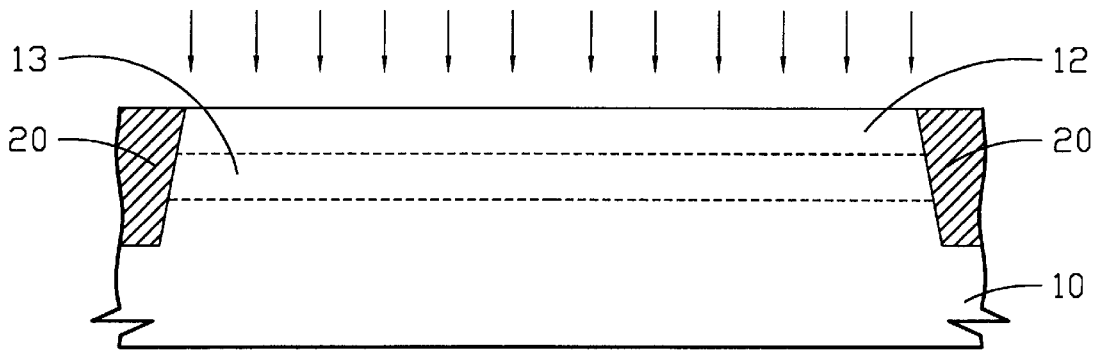

Referring to FIG. 2B, a channel region 12 and an APIA region 13 are formed in the substrate 10 by using ion-implantation, in which the conductivity type of the channel region 12 and the APT region 13 are the same with the substrate 10 and the dose of the APT region 13 is large than the channel region 12. In this embodiment, the junction depth of the channel region 12 is about equal to the pre-LDD region, and the junction depth of the APT region 13 is about equal to the pre-source/drain regions.

Figure 2C:
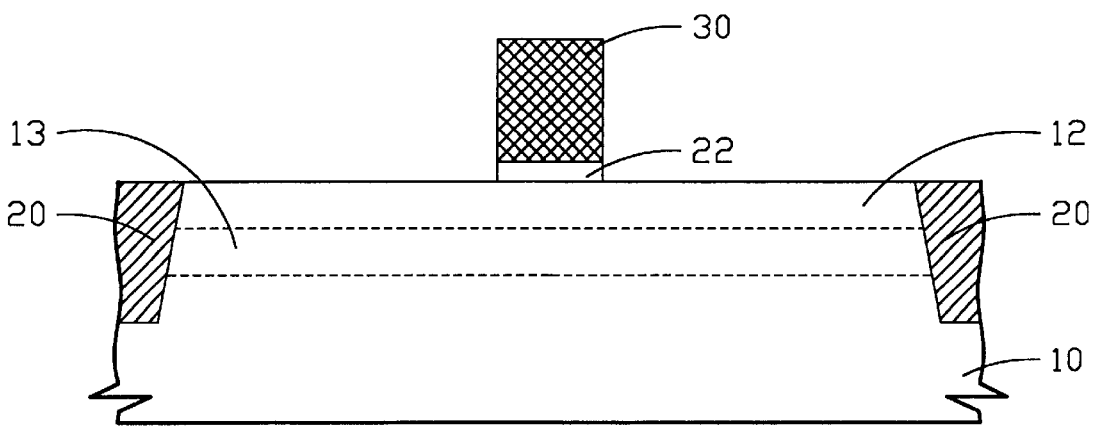

Subsequently, referring to FIG. 2C, a gate oxide layer 22 and a poly gate layer 30 are formed on the active area. The method for forming the gate is to form a thin silicon oxide layer by conventional oxidation on the substrate 10 and then to form a polysilicon layer by using conventional chemical vapor deposition method on the silicon oxide layer. Then, a portion of the polysilicon layer and the silicon oxide layer is etched using conventional lithography to form the gate oxide layer 22 and poly gate 30 in the FIGURE.

Figure 2D:
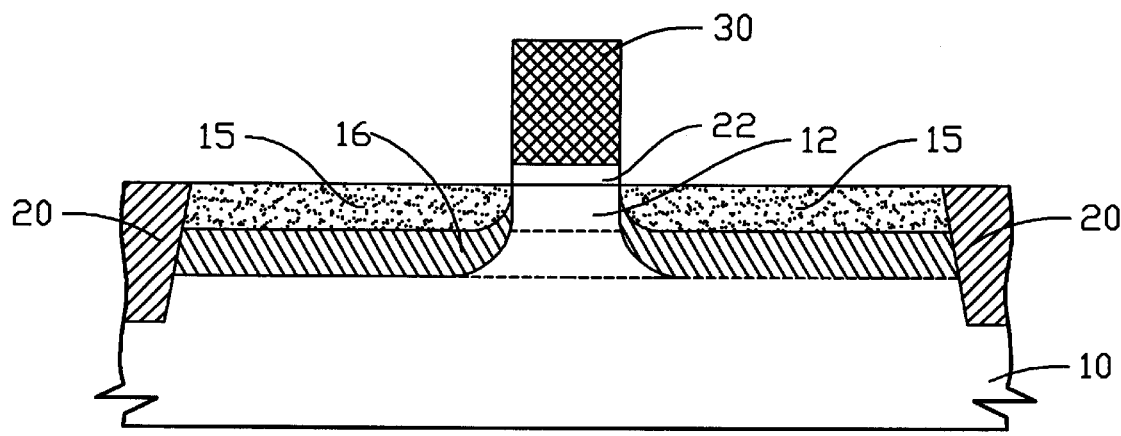

Referring to the FIG. 2D, which is the key step of this invention, silicon is implanted into a point defect region 16 in the APT region 13 by using conventional implantation step, in which the point defect region 16 is under the pre-LDD region. The main purpose of this implantation is to destroy the structure of the pocket region 16 in the substrate 10 for inducing point defects, in which the implant energy is between about 30 to 80 KeV, and the implant dose is between about 1E13 to 5E14/cm$^3$. Because the dopant in the implantation is silicon, the generated point defects will attract the dopant in the APT region 13 to diffuse to the pocket region 16 after annealing and which will not make any impact on the substrate 10. The concentration of the pocket region 16 is then increased, while the resistant of LDD region does not increase. The annealing method is to put the wafer into furnace at a temperature of about 800 to 1100° C. for 10 to 60 minutes.

The following step is to form LDD regions 15 in the substrate 10 by using the conventional ion-implantation, in which the conductivity type is opposite to the substrate 10.

Figure 2E:
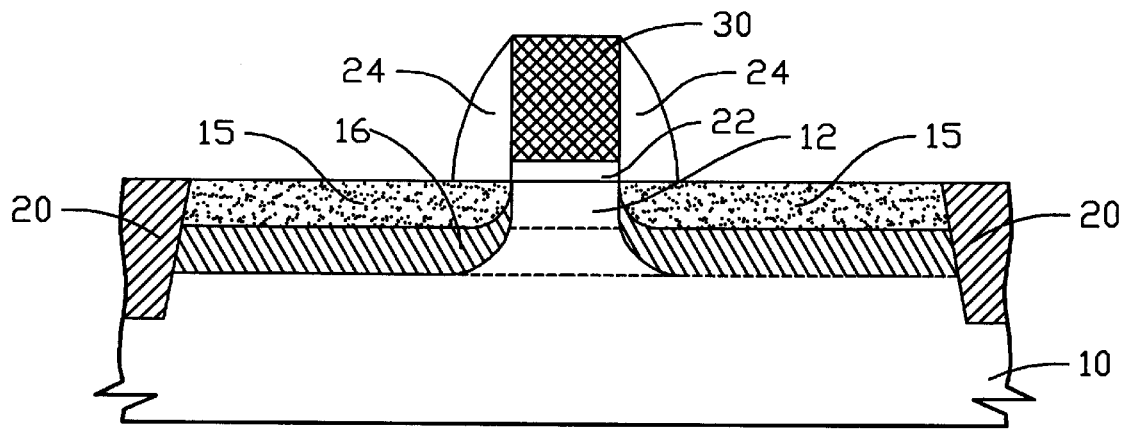

Referring to FIG. 2E, spacers 24 are formed on the sidewall of the gate 30. The method for forming the spacers 24 is depositing a conformal dielectric layer and the anisotropically blanket etching a thickness of the dielectric layer to form the spacers 24. The material of the dielectric layer can be silicon oxide or silicon nitride, and the method for depositing the dielectric layer can be LPCVD (low pressure chemical vapor deposition) method.

Figure 2F:
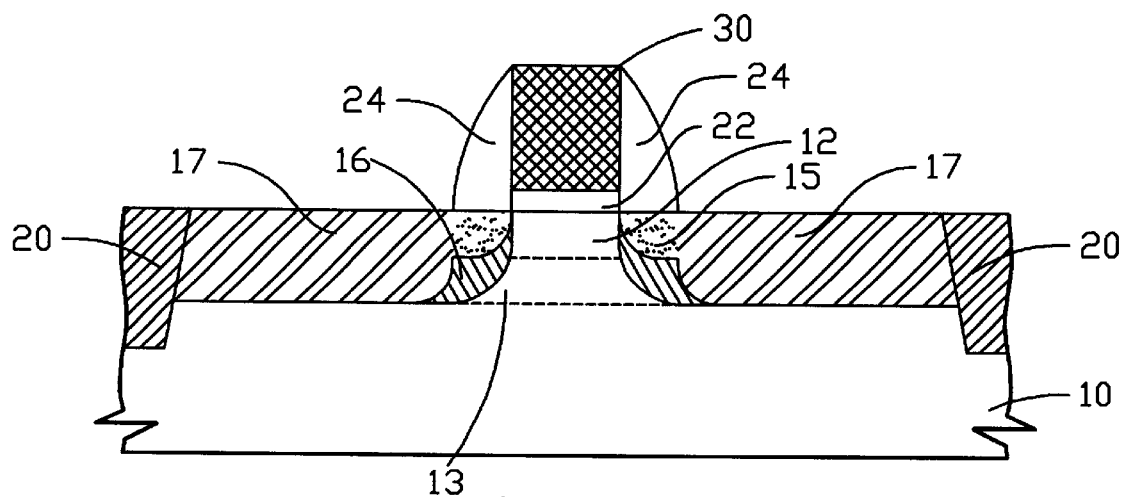

Referring to FIG. 2F, source/drain regions 17 are formed by using conventional ion-implantation, in which the conductivity type of the source/drain regions 17 is opposite to the substrate 10.

To sum up, the present invention is to provide a method for forming pocket region in a semiconductor transistor that substantially does not increase resistant of LDD region and decreases the short channel effect, such that the performance of a MOS transistor is increased.

Although specific embodiments have been illustrated and described, it will be obvious to those skilled in the art that various modifications may be made without departing from what is intended to be limited solely by the appended claims.

What is claimed is:

1. A method for forming a pocket region in a substrate of a metal-oxide-semiconductor device, said substrate having a channel region under a gate of said device, said channel region having an anti-punch-through region formed thereunder, a lightly-doped drain region being under the edge of said gate, said method comprising:

implanting silicon at a region between said anti-punch-through region and a pre-defined source/drain region to form a point defect region under said lightly-doped drain region; and annealing said substrate such that the dopant in said anti-punch-through region diffuses into said point defect region.

2. The method according to claim 1, wherein the energy of said silicon implantation is between about 30 to 80 KeV,.

3. The method according to claim 1, wherein the concentration of said silicon implantation is between about 1E13 to 5E14/cm$^3$.

4. The method according claim 1, wherein said annealing comprises placing said substrate into a furnace at a temperature of between about 800 to 1100° C., and the duration of annealing is between about 10 to 60 minutes.

5. The method according to claim 1, further comprising forming a source/drain region to form a metal-oxide-semiconductor transistor.

6. The method according to claim 1, further comprising forming a source/drain region to form a metal-oxide-semiconductor transistor.

7. A method for reducing short channel effect, said method comprises:

provided a substrate with a channel region and an anti-punch-through region formed thereunder, in which said channel region is at the top of said substrate and said anti-punch-through region is under said channel region;

forming a gate on said substrate;

implanting silicon at a region between said anti-punch-through region and a pre-defined source/drain region to form a point defect region under said lightly-doped drain region; and annealing said substrate such that the dopant in said anti-punch-through region diffuses into said point defect region.

8. The method according to claim 7, wherein the energy of said silicon implantation is between about 30 to 80 KeV.

9. The method according to claim 7, wherein the concentration of said silicon implantation is between about 1E13 to 5E14/cm$^3$.

10. The method according claim 7, wherein said annealing comprises placing said substrate into a furnace at a temperature between about 800 to 1100° C., and the duration of annealing is between about 10 to 60 minutes.

11. A method for forming a metal-oxide-semiconductor transistor, said method comprises:

providing a substrate of a first conductivity type;

forming a channel region and an anti-punch-through region of said first conductivity type in said substrate, in which said channel region is at the top of said substrate and said anti-punch-through region is under said channel region;

forming a gate on said substrate;

implanting silicon at a region between said anti-punch-through region and a pre-defined source/drain region to form a point defect region under said lightly-doped drain region;

annealing said substrate such that the dopant in said anti-punch-through region diffuses into said point defect region;

forming a light-doped-drain region of a second conductivity type, said second conductivity type being opposite to said first conductivity type;

forming a conformal dielectric layer on said substrate and said gate;

anisotropically blanket etching said dielectric layer to form a spacer on the sidewall of said gate; and forming source/drain regions of said second conductivity type.

12. The method according to claim 11, wherein the energy of said silicon implantation is between about 30 to 80 KeV.

13. The method according to claim 11, wherein the concentration of said silicon implantation is between about 1E13 to 5E14/cm$^3$.

14. The method according claim 11, wherein said annealing comprises placing said substrate into a furnace at a temperature of between about 800 to 1100° C., and the duration of annealing is between about 10 to 60 minutes.

* * * * *